(12) United States Patent
Baggen et al.

(10) Patent No.: US 6,304,612 B1
(45) Date of Patent: Oct. 16, 2001

(54) TRANSMISSION SYSTEM HAVING A SIMPLIFIED CHANNEL DECODER

(75) Inventors: Constant P. M. J. Baggen; Arie G. C. Koppelaar, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/316,985

(22) Filed: May 24, 1999

(30) Foreign Application Priority Data

May 26, 1998 (EP) .................................................. 98201738

(51) Int. Cl.[7] .................................................. H04L 23/02
(52) U.S. Cl. .......................... 375/262; 375/265; 375/241; 714/792; 714/795
(58) Field of Search .................................. 375/261, 262, 375/265, 341; 714/786, 771, 792, 794, 795, 796

(56) References Cited

U.S. PATENT DOCUMENTS

| | | | |
|---|---|---|---|
| 5,349,589 | * | 9/1994 | Chennakeshu et al. ................ 371/43 |
| 5,369,671 | * | 11/1994 | Yehushua et al. ...................... 375/94 |
| 5,881,073 | * | 3/1999 | Wan et al. ........................... 371/43.1 |
| 5,887,007 | * | 3/1999 | Iwata et al. ......................... 371/43.7 |
| 5,905,742 | * | 5/1999 | Chennakeshu et al. ............. 371/43.4 |
| 6,161,210 | * | 12/2000 | Chen et al. ........................... 714/786 |

* cited by examiner

Primary Examiner—Stephen Chin
Assistant Examiner—Dac V. Ha
(74) Attorney, Agent, or Firm—Jack D. Slobod

(57) ABSTRACT

In a tailbiting convolutional encoder the encoder (12) is initialized with a sequence of symbols corresponding to the final symbols of a sequence to be encoded, resulting in that the begin state and the final state of the encoder are the same. The problem of the convolutional code obtained by such a coder is that it requires a substantial computational resources to decode it. In the simplified decoder according to the invention, the decoding process is extended by a plurality of trellis sections to a length N+v. At the final trellis section, the state with the largest path metric is selected as the best state. This best state is used as staring point for a trace back operation to find an earlier state at N trellis section before the final trellis section. The earlier state found there is regarded as correct, having as consequence that the trellis should terminate also in said state. By performing a trace back from said state the source symbols can be found.

11 Claims, 5 Drawing Sheets

TRANSMISSION SYSTEM HAVING A SIMPLIFIED CHANNEL DECODER

BACKGROUND OF THE INVENTION

The present invention relates to a transmission system comprising a transmitter having a channel encoder for encoding sequences of source symbols into sequences of channel symbols, the channel encoder being initialized into a state corresponding to the final state of the channel encoder after having encoded the sequence of source symbols, the transmitter being arranged for transmitting a channel signal representing the channel symbols to a receiver, the receiver comprising a channel decoder for deriving the sequences of source symbols from a channel signal representing the channel symbols by keeping track of a plurality of state sequences with a corresponding likelihood measure representing the likelihood of the state sequences.

Such transmission systems are used for transmitted sequences of source symbols in a reliable way to a receiver. Application of such transmission systems include mobile telephony systems in which frames comprising an encoded speech signal have to be transmitted from a base station to a mobile terminal and vice versa.

In order to achieve a reliable transmission, the sequences of source symbols are encoded into sequences of channels symbols by a channel encoder. The channel encoder can e.g. be a convolutional encoder which is initialized in a predetermined state. This predetermined state is often the zero state corresponding to the v last symbols in the sequence of source symbols. A disadvantage of this is that the last symbols of the source symbols should be set to zero. This reduces the number of source symbols which can be transmitted in one sequence of channel symbols.

The reduction of the number of source symbols can be prevented by initializing the channel encoder to a state which is defined by the last source symbols in the sequence of source symbols. It is known to initialize the channel encoder in a state which is the same as the state of the channel encoder after the encoding of said last source symbols. Codes using the above mechanism are known as "tail biting" codes. Combinations of "zero tailing" codes and "tailbiting" codes are also conceivable.

It is however conceivable that the channel encoder is initialized in a state which is different from the state of the channel encoder after the encoding of said last source symbols. However in such a case there should be a one to one relationship between the state of the channel encoder after the encoding of said last source symbols, and the state to which the channel encoder is initialized before starting decoding.

A disadvantage of tailbiting codes is that the decoding complexity increases substantially, because the decoding should in principle be performed for each possible initial state. If the code has 32 possible states (v=5), the decoding complexity is increased with a factor 32. It has been shown that it is possible to reduce the complexity by decoding the channel signal repeatedly in a circular fashion, but the complexity is still a few times the complexity of an decoder for a code initialized in a state known to the channel decoder.

SUMMARY OF THE INVENTION

An object of the present invention is to provide a transmission system according to the preamble in which the complexity of the channel decoder is substantially decreased.

To achieve said purpose, the transmission system according to the present invention is characterized in that the channel decoder is arranged for selecting a suitable state sequence after the channel signal has been processed at least once, determining from said suitable state sequence, an earlier state in said suitable state sequence, and in that the channel decoder is arranged for selecting as final state sequence the state sequence terminating in a state corresponding to said earlier state.

The present invention is based on the recognition that the earlier state determined from the suitable state sequence is almost always correct. By using the known relation between said earlier state and the proper terminating state, it becomes possible to select said terminating state with a high reliability. As is stated above, the terminating state can be the same as the earlier state, but it is also possible that there is a different predetermined relation between the terminal state and the earlier state. The suitable state sequence is preferably the most likely state sequence. This state has a likelihood measure indicating a largest likelihood. If the number of states between the final state and the earlier state is large enough, each state is a suitable state as starting point for searching the earlier state.

An embodiment of the invention is characterized in that the channel decoder is arranged for extending, on basis of a cyclically extended channel signal, the state sequence beyond a number of states equal to the number of source symbols in a sequence of source symbols and in that the channel decoder is arranged for selecting the final state sequence on basis of the terminating states of the extended state sequences.

By extending the state sequence, it becomes possible to increase the reliability of the detection substantially with only a small extension of the state sequence. Simulations have shown that in the transmission system according to the invention only a small extension of the state sequence is required to increase the detection reliability substantially. It is observed that without using the measures according to the invention the length of the extended state sequence should be a few times the length of the basic state sequence.

A further embodiment of the invention is characterized in that the channel decoder is arranged for determining the suitable state sequence when the state sequences comprise a number of states equal to the number of source symbols in a sequence of source symbols.

Simulations have shown that a suitable instant to determine the most likely state is when the number of states in the state sequence is equal to the number of source symbols.

A preferred embodiment of the invention is characterized in that the channel encoder is arranged for determining the suitable state sequence from terminating states of the extended state sequence.

Simulations have shown that by determining the most likely state from the terminating state of the extended state sequence, the performance of the decoder can be enhanced slightly without adding any complexity.

A still further embodiment of the invention is characterized in that the channel decoder is arranged for determining the state sequence by selecting the state sequence by comparing the likelihood measures of a plurality of candidate state sequences terminating in said state, in that the channel decoder is arranged for determining a difference measure between the likelihood measure of the selected candidate sequence and the likelihood measure of the rejected candidate sequences, in that the channel decoder is arranged for determining for the final state sequence the minimum value of the difference measure. In the channel decoder according to the invention, new states are added to the actual state sequences by creating from each state sequence a plurality of candidate state sequences, each of the candidate sequences terminating in one of the possible new states. By comparing for each of the new states the likelihood of the new state sequences leading to said new state, the new state sequence with the largest likelihood can be selected. This selected state sequence is called the survivor. A measure for the reliability of this selection is the difference between the likelihood of the survivor and the likelihood of the other state sequences.

By selecting the minimum value of said difference corresponding to the finally selected state sequence, a transmission quality measure for said sequence of channel symbols is obtained.

A still further embodiment of the invention is characterized in that the channel decoder is arranged for keeping track of the minimum difference measure for each of the state sequences.

By keeping track of the minimum difference measure, the minimum difference measure can be made available in an easy way, because it is already present in a memory element associated with the finally selected state. For keeping track of the minimum difference measure, only one memory element for each possible state is required.

BRIEF DESCRIPTION OF THE DRAWINGS

The present invention will now be explained with reference to the drawings.

DETAILED DESCRIPTION OF THE PREFERRED EMBODIMENT

Figure 1:
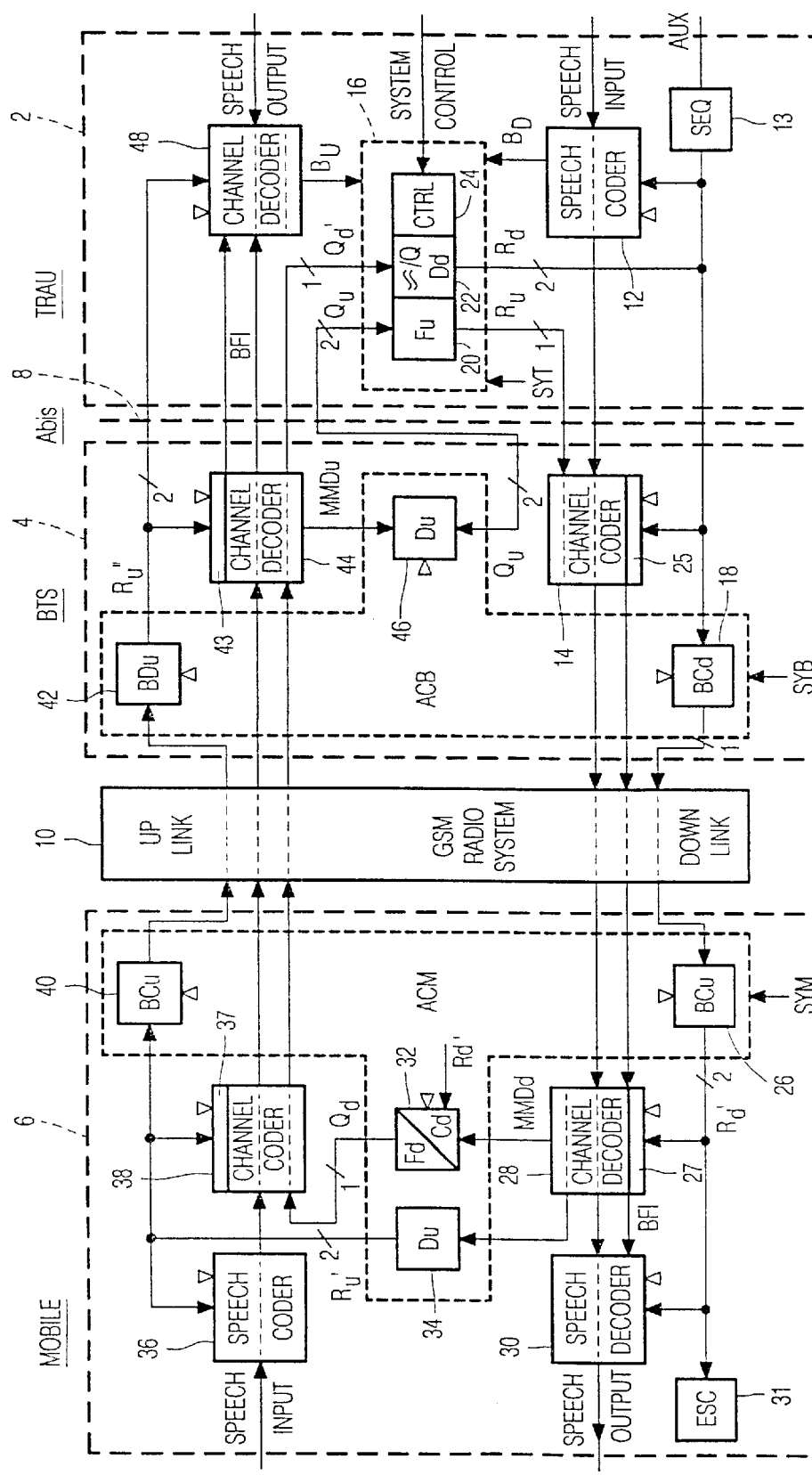
FIG. 1 shows a transmission system in which the present invention can be used.

The transmission system according to FIG. 1, comprises three important elements being the TRAU (Transcoder and Rate Adapter Unit) 2, the BTS (Base Transceiver Station) 4 and the Mobile Station 6. The TRAU 2 is coupled to the BTS 4 via the A-bis interface 8. The BTS 4 is coupled to the Mobile Unit 6 via an Air Interface 10.

A main signal being here a speech signal to be transmitted to the Mobile Unit 6, is applied to a speech encoder 12. A first output of the speech encoder 12 carrying an encoded speech signal, also referred to as source symbols, is coupled to a channel encoder 14 via the A-bis interface 8. A second output of the speech encoder 12, carrying a background noise level indicator $B_D$ is coupled to an input of a system controller 16. A first output of the system controller 16 carrying a coding property, being here a downlink rate assignment signal $R_D$ is coupled to the speech encoder 12 and, via the A-bis interface, to coding property setting means 15 in the channel encoder 14 and to a further channel encoder being here a block coder 18. A second output of the system controller 16 carrying an uplink rate assignment signal $R_U$ is coupled to a second input of the channel encoder 14. The two-bit rate assignment signal $R_U$ is transmitted bit by bit over two subsequent frames. The rate assignment signals $R_D$ and $R_U$ constitute a request to operate the downlink and the uplink transmission system on a coding property represented by $R_D$ and $R_U$ respectively.

It is observed that the value of $R_D$ transmitted to the mobile station 6 can be overruled by the coding property sequencing means 13 which can force a predetermined sequence of coding properties, as represented by the rate assignment signal $R_U$, onto the block encoder 18 the channel encoder 14 and the speech encoder 13. This predetermined sequence can be used for conveying additional information to the mobile station 6, without needing additional space in the transmission frame. It is possible that more than one predetermined sequence of coding properties is used. Each of the predetermined sequences of coding properties corresponds to a different auxiliary signal value.

The system controller 16 receives from the A-bis interface quality measures $Q_U$ and $Q_D$ indicating the quality of the air interface 10 (radio channel) for the uplink and the downlink. The quality measure $Q_U$ is compared with a plurality of threshold levels, and the result of this comparison is used by the system controller 16 to divide the available channel capacity between the speech encoder 36 and the channel encoder 38 of the uplink. The signal $Q_D$ is filtered by low pass filter 22 and is subsequently compared with a plurality of threshold values. The result of the comparison is used to divide the available channel capacity between the speech encoder 12 and the channel encoder 14. For the uplink and the downlink four different combinations of the division of the channel capacity between the speech encoder 12 and the channel encoder 14 are possible. These possibilities are presented in the table below.

TABLE 1

| $R_X$ | $R_{SPEECH}$(kbit/s) | $R_{CHANNEL}$ | $R_{TOTAL}$(kbit/s) |
|---|---|---|---|
| 0 | 5.5 | ¼ | 22.8 |
| 1 | 8.1 | ⅜ | 22.8 |
| 2 | 9.3 | 3/7 | 22.8 |
| 3 | 11.1 | ½ | 22.8 |
| 0 | 5.5 | ½ | 11.4 |
| 1 | 7.0 | ⅝ | 11.4 |
| 2 | 8.1 | ¾ | 11.4 |
| 3 | 9.3 | 6/7 | 11.4 |

Table 1 it can be seen that the bitrate allocated to the speech encoder 12 and the rate of the channel encoder increases with the channel quality. This is possible because at better conditions the channel encoder can provide the required transmission quality (Frame Error Rate) using a lower bitrate. The bitrate saved by the larger rate of the channel encoder is exploited by allocating it to the speech encoder 12 in order to obtain a better speech quality. It is observed that the coding property is here the rate of the channel encoder 14. The coding property setting means 15 are arranged for setting the rate of the channel encoder 14 according to the coding property supplied by the system controller 16.

Under bad channel conditions the channel encoder needs to have a lower rate in order to be able to provide the required transmission quality. The channel encoder will be a variable rate convolutional encoder which encodes the output bits of the speech encoder 12 to which an 8 bit is added. The variable rate can be obtained by using different convolutional codes having different basic rate or by using puncturing of a convolutional code with a fixed basic rate. Preferably a combination of these methods is used.

In Table 1 presented below the properties of the convolutional codes given in Table 1 are presented. All these convolutional codes have a value v equal to 5.

TABLE 2

| Pol/Rate | 1/2 | 1/4 | 3/4 | 3/7 | 3/8 | 5/8 | 6/7 |
|---|---|---|---|---|---|---|---|
| $G_1 = 3$ |  |  |  |  |  |  | 000002 |
| $G_2 = 45$ |  |  |  | 003 |  | 00020 |  |
| $G_3 = 47$ |  |  | 001 |  | 301 | 01000 |  |
| $G_4 = 51$ |  | 4 |  |  |  | 00002 | 101000 |
| $G_5 = 53$ |  |  |  | 202 |  |  |  |
| $G_6 = 55$ |  | 3 |  |  |  |  |  |
| $G_7 = 57$ | 2 |  |  | 020 | 230 |  |  |
| $G_8 = 61$ |  |  | 002 |  |  |  |  |
| $G_9 = 65$ | 1 |  | 110 |  | 022 | 02000 | 000001 |
| $G_{10} = 66$ |  |  |  |  |  |  |  |
| $G_{11} = 67$ |  | 2 |  |  |  |  | 000010 |
| $G_{12} = 71$ |  |  | 001 |  |  |  |  |
| $G_{13} = 73$ |  |  |  |  | 010 |  |  |
| $G_{14} = 75$ |  |  | 110 |  | 100 | 10000 | 000100 |
| $G_{15} = 77$ |  | 1 |  |  |  | 00111 | 010000 |

In Table 2 the values $G_i$ represent the generator polynomials. The generator polynomials G(n) are defined according to:

$$G_i(D) = g_0 \oplus g_1 \cdot D \oplus \ldots \oplus g_{n-1} 19\ D^{n-1} \oplus g_n \cdot D^n \quad (A)$$

In (1) ⊕ ED is a modulo-2 addition. i is the octal representation of the sequence $g_0, g_1, \ldots g_{v-1}, g_v$.

For each of the different codes the generator polynomials used in it, are indicated by a number in the corresponding cell. The number in the corresponding cell indicates for which of the source symbols, the corresponding generator polynomial is taken into account Furthermore said number indicates the position of the coded symbol derived by using said polynomial in the sequence of source symbols. Each digit indicates the position in the sequence of channel symbols, of the channel symbol derived by using the indicated generator polynomial. For the rate ½ code, the generator polynomials 57 and 65 are used. For each source symbol first the channel symbol calculated according to polynomial 65 is transmitted, and secondly the channel symbol according to generator polynomial 57 is transmitted. In a similar way the polynomials to be used for determining the channel symbols for the rate ¼ code can be determined from Table 3. The other codes are punctured convolutional codes. If a digit in the table is equal to 0, it means that the corresponding generator polynomial is not used for said particular source symbol. From Table 2 can be seen that some of the generator polynomials are not used for each of the source symbols. It is observed that the sequences of numbers in the table are continued periodically for sequences of input symbols longer than 1, 3, 5 or 6 respectively.

It is observed that Table 1 gives the values of the bitrate of the speech encoder 12 and the rate of the channel encoder 14 for a full rate channel and a half rate channel. The decision about which channel is used is taken by the system operator, and is signaled to the TRAU 2, the BTS 4 and the Mobile Station 6, by means of an out of band control signal, which can be transmitted on a separate control channel. 16. To the channel encoder 14 also the signal $R_U$ is applied.

The block coder 18 is present to encode the selected rate $R_D$ for transmission to the Mobile Station 6. This rate $R_D$ is encoded in a separate encoder for two reasons. The first reason is that it is desirable to inform the channel decoder 28 in the mobile station of a new rate $R_D$ before data encoded according to said rate arrives at the channel decoder 28. A second reason is that it is desired that the value $R_D$ is better protected against transmission errors than it is possible with the channel encoder 14. To enhance the error correcting properties of the encoded $R_D$ value even more, the codewords are split in two parts which are transmitted in separate frames. This splitting of the codewords allows longer codewords to be chosen, resulting in further improved error correcting capabilities.

The block coder 18 encodes the coding property $R_D$ which is represented by two bits into an encoded coding property encoded according to a block code with codewords of 16 bits if a full rate channel is used. If a half rate channel is used, a block code with codewords of 8 bits are used to encode the coding property. The codewords used are presented below in Table 3 and Table 4.

TABLE 3

Half Rate Channel

| $R_D[1]$ | $R_D[2]$ | $C_0$ | $C_1$ | $C_2$ | $C_3$ | $C_4$ | $C_5$ | $C_6$ | $C_7$ |
|---|---|---|---|---|---|---|---|---|---|
| 0 | 0 | 0 | 0 | 0 | 0 | 0 | 0 | 0 | 0 |
| 0 | 1 | 0 | 0 | 1 | 1 | 1 | 1 | 0 | 1 |
| 1 | 0 | 1 | 1 | 0 | 1 | 0 | 0 | 1 | 1 |
| 1 | 1 | 1 | 1 | 1 | 0 | 1 | 1 | 1 | 0 |

TABLE 4

Full Rate Channel

| $R_D[1]$ | $R_D[2]$ | $C_0$ | $C_1$ | $C_2$ | $C_3$ | $C_4$ | $C_5$ | $C_6$ | $C_7$ | $C_8$ | $C_9$ | $C_{10}$ | $C_{11}$ | $C_{12}$ | $C_{13}$ | $C_{14}$ | $C_{15}$ |
|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 |
| 0 | 1 | 0 | 0 | 1 | 1 | 1 | 1 | 0 | 1 | 0 | 0 | 1 | 1 | 1 | 1 | 0 | 1 |
| 1 | 0 | 1 | 1 | 0 | 1 | 0 | 0 | 1 | 1 | 1 | 1 | 0 | 1 | 0 | 0 | 1 | 1 |
| 1 | 1 | 1 | 1 | 1 | 0 | 1 | 1 | 1 | 0 | 1 | 1 | 1 | 0 | 1 | 1 | 1 | 0 |

From Table 3 and Table 4, it can be seen that the codewords used for a full rate channel are obtained by repeating the codewords used for a half rate channel, resulting in improved error correcting properties. In a half-rate channel, the symbols $C_0$ to $C_3$ are transmitted in a first frame, and the bits $C_4$ to $C_7$ are transmitted in a subsequent frame. In a full-rate channel, the symbols $C_0$ to $C_7$ are transmitted in a first frame, and the bits $C_8$ to $C_{15}$ are transmitted in a subsequent frame.

The outputs of the channel encoder 14 and the block encoder 18 are transmitted in time division multiplex over the air interface 10. It is however also possible to use CDMA for transmitting the several signals over the air interface 10. In the Mobile Station 6, the signal received from the air interface 10 is applied to a channel decoder 28 and to a further channel decoder being here a block decoder 26. The block decoder 26 is arranged for deriving the coding property represented by the $R_D$ bits by decoding the encoded coding property represented by codeword $C_0 \ldots C_N$, in which N is 7 for the half rate channel and N is 15 for the full rate channel.

The block decoder 26 is arranged for calculating the correlation between the four possible codewords and its input signal. This is done in two passes because the codewords are transmitted in parts in two subsequent frames. After the input signal corresponding to the first part of the codeword has been received, the correlation value between the first parts of the possible codewords and the input value are calculated and stored. When in the subsequent frame, the input signal corresponding to the second part of the codeword is received, the correlation value between the second parts of the possible codewords and the input signal are calculated and added to the previously stored correlation value, in order to obtain the final correlation values. The value of $R_D$ corresponding to the codeword having the largest correlation value with the total input signal, is selected as the received codeword representing the coding property, and is passed to the output of the block decoder 26. The output of the block decoder 26 is connected to a control input of the property setting means in the channel decoder 28 and to a control input of the speech decoder 30 for setting the rate of the channel decoder 28 and the bitrate of the speech decoder 30 to a value corresponding to the signal $R_D$.

The channel decoder 28 decodes its input signal, and presents at a first output an encoded speech signal to an input of a speech decoder 30.

The channel decoder 28 presents at a second output a signal BFI (Bad Frame Indicator) indicating an incorrect reception of a frame. This BFI signal is obtained by calculating a checksum over a part of the signal decoded by a convolutional decoder in the channel decoder 28, and by comparing the calculated checksum with the value of the checksum received from the air interface 10.

The speech decoder 30 is arranged for deriving a replica of the speech signal of the speech encoder 12 from the output signal of the channel decoder 20. In case a BFI signal is received from the channel decoder 28, the speech decoder 30 is arranged for deriving a speech signal based on the previously received parameters corresponding to the previous frame. If a plurality of subsequent frames are indicated as bad frame, the speech decoder 30 can be arranged for muting its output signal.

The channel decoder 28 provides at a third output the decoded signal $R_U$. The signal $R_U$ represents a coding property being here a bitrate setting of the uplink. Per frame the signal $R_U$ comprises 1 bit (the RQI bit). In a deformatter 34 the two bits received in subsequent frames are combined in a bitrate setting $R_U'$ for the uplink which is represented by two bits. This bitrate setting $R_U'$ which selects one of the possibilities according to Table 1 to be used for the uplink is applied to a control input of a speech encoder 36, to a control input of a channel encoder 38, and to an input of a further channel encoder being here a block encoder 40. If the channel decoder 20 signals a bad frame by issuing a BFI signal, the decoded signal $R_U$ is not used for setting the uplink rate, because it is regarded as unreliable The channel decoder 28 provides at a fourth output a quality measure MMDd. This measure MMD can easily be derived when a Viterbi decoder is used in the channel decoder. This quality measure is filtered in the processing unit 32 according to a first order filter. For the output signal of the filter in the processing unit 32 can be written:

$$MMD'[n]=(1-\alpha) \cdot MMD[n]+\alpha \cdot MMD'[n-1] \qquad (B)$$

After the bitrate setting of the channel decoder 28 has been changed in response to a changed value of $R_D$, the value of MMD'[n−1] is set to a typical value corresponding to the long time average of the filtered MMD for the newly set bitrate and for a typical downlink channel quality. This is done to reduce transient phenomena when switching between different values of the bitrate.

The output signal of the filter is quantized with 2 bits to a quality indicator $Q_D$ The quality indicator $Q_D$ is applied to a second input of the channel encoder 38. The 2 bit quality indicator $Q_D$ is transmitted once each two frames using one bit position in each frame.

A speech signal applied to the speech encoder 36 in the mobile station 6 is encoded and passed to the channel encoder 38. The channel encoder 38 calculates a CRC value over its input bits, adds the CRC value to its input bits, and encodes the combination of input bit and CRC value according to the convolutional code selected by the signal $R_U'$ from Table 1.

The block encoder 40 encodes the signal $R_U'$ represented by two bits according to Table 3 or Table 4 dependent on whether a half-rate channel or a full-rate channel is used. Also here only half a codeword is transmitted in a frame. The output signals of the channel encoder 38 and the block encoder 40 in the mobile station 6 are transmitted via the air interface 10 to the BTS 4. In the BTS 4, the block coded signal $R_U'$ is decoded by a further channel decoder being here a block decoder 42. The operation of the block decoder 42 is the same as the operation of the block decoder 26. At the output of the block decoder 42 a decoded coding property represented by a signal $R_U''$ is available. This decoded signal $R_U''$ is applied to a control input of coding property setting means in a channel decoder 44 and is passed, via the A-bis interface, to a control input of a speech decoder 48.

In the BTS 4, the signals from the channel encoder 38, received via the air interface 10, are applied to the channel decoder 44. The channel decoder 44 decodes its input signals, and passes the decoded signals via the A-bis interface 8 to the TRAU 2. The channel decoder 44 provides a quality measure MMDu representing the transmission quality of the uplink to a processing unit 46. The processing unit 46 performs a filter operation similar to that performed in the processing unit 32 and 22. Subsequently the result of the filter operation is quantized in two bits and transmitted via the A-tis interface 8 to the TRAU 2.

In the system controller 16, a decision unit 20 determines the bitrate setting $R_U$ to be used for the uplink from the quality measure $Q_U$. Under normal circumstances, the part of the channel capacity allocated to the speech coder will increase with increasing channel quality. The rate $R_U$ is transmitted once per two frames.

The signal $Q_D'$ received from the channel decoder 44 is passed to a processing unit 22 in the system controller 16. In the processing unit 22, the bits representing $Q_D'$ received in two subsequent frames are assembled, and the signal $Q_D'$ is filtered by a first order low-pass filter, having similar properties as the low pass filter in the processing unit 32.

The filtered signal $Q_D'$ is compared with two threshold values which depend on the actual value of the downlink rate $R_D$. If the filtered signal $Q_D'$ falls below the lowest of said threshold value, the signal quality is too low for the rate $R_D$, and the processing unit switches to a rate which is one step lower than the present rate. If the filtered signal $Q_D'$ exceeds the highest of said threshold values, the signal quality is too high for the rate $R_D$, and the processing unit switches to a rate which is one step higher than the present rate. The decision taking about the uplink rate $R_U$ is similar as the decision taking about the downlink rate $R_D$.

Again, under normal circumstances, the part of the channel capacity allocated to the speech coder will increase with increasing channel quality. Under special circumstances the signal $R_D$ can also be used to transmit a reconfiguration signal to the mobile station. This reconfiguration signal can e.g. indicate that a different speech encoding/decoding and or channel coding/decoding algorithm should be used. This reconfiguration signal can be encoded using a special predetermined sequence of $R_D$ signals. This special predetermined sequence of $R_D$ signals is recognised by an escape sequence decoder 31 in the mobile station, which is arranged for issuing a reconfiguration signal to the effected devices when a predetermined (escape) sequence has been detected. The escape sequence decoder 30 can comprise a shift register in which subsequent values of $R_D$ are clocked. By comparing the content of the shift register with the predetermined sequences, it can easily be detected when an escape sequence is received, and which of the possible escape sequences is received.

An output signal of the channel decoder 44, representing the encoded speech signal, is transmitted via the A-Bis interface to the TRAU 2. In the TRAU 2, the encoded speech signal is applied to the speech decoder 48. A signal BFI at the output of the channel decoder 44, indicating the detecting of a CRC error, is passed to the speech decoder 48 via the A-Bis interface 8. The speech decoder 48 is arranged for deriving a replica of the speech signal of the speech encoder 36 from the output signal of the channel decoder 44. In case a BFI signal is received from the channel decoder 44, the speech decoder 48 is arranged for deriving a speech signal based on the previously received signal corresponding to the previous frame, in the same way as is done by the speech decoder 30. If a plurality of subsequent frames are indicated as bad frame, the speech decoder 48 can be arranged for performing more advanced error concealment procedures.

Figure 2:
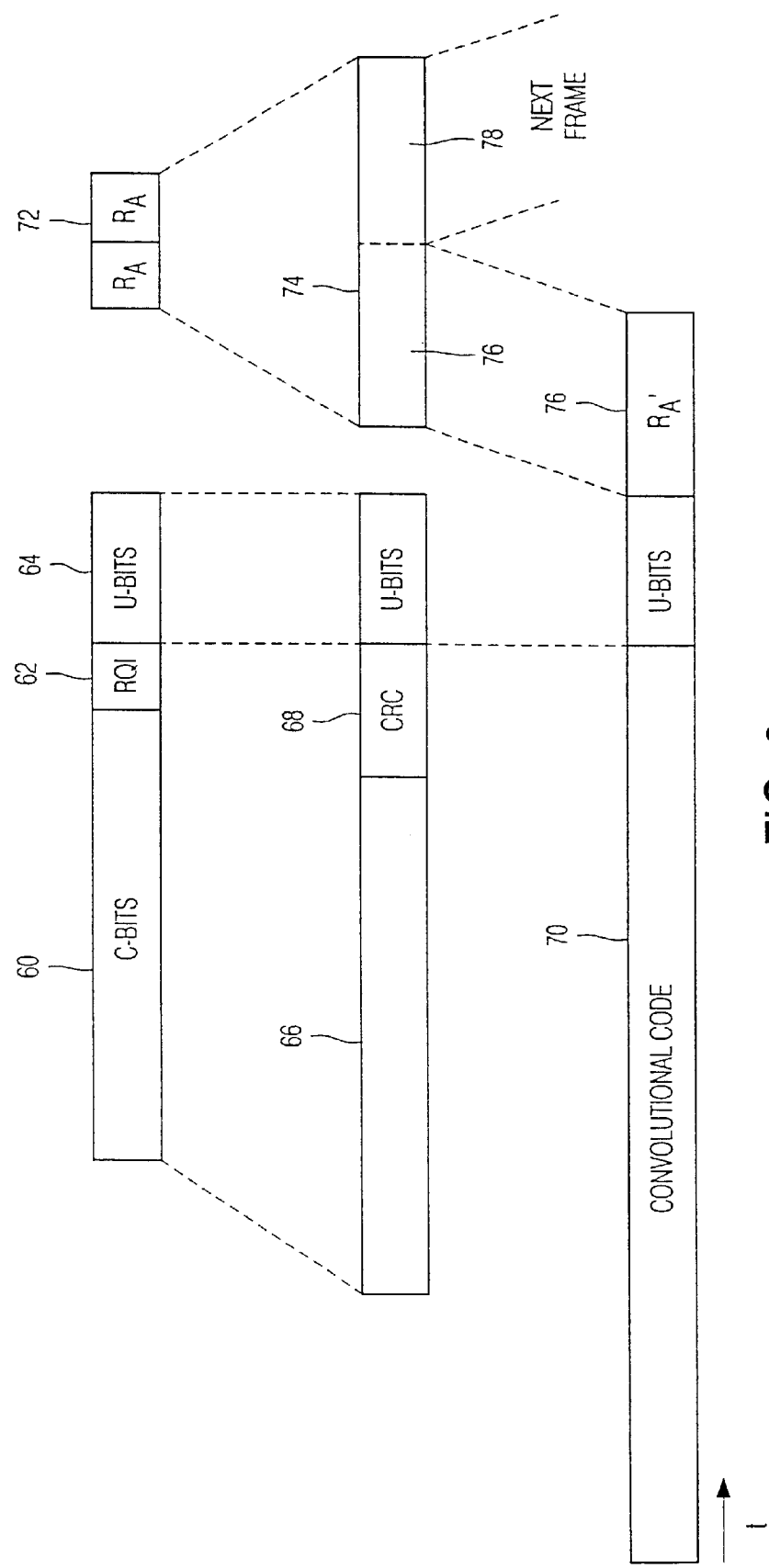
FIG. 2 shows a frame format for use with a transmission system according to FIG. 1.

FIG. 2 shows the frame format used in a transmission system according to the invention. The speech encoder 12 or 36 provides a group 60 of C-bits which should be protected against transmission errors, and a group 64 of U-bits which do not have to be protected against transmission errors. The further sequence comprises the U-bits. The decision unit 20 and the processing unit 32 provide one bit RQI 62 per frame for signalling purposes as explained above.

The above combination of bits is applied to the channel encoder 14 or 38 which first calculates a CRC over the combination of the RQI bit and the C-bits, and appends 8 CRC bits behind the C-bits 60 and the RQI bit 62. The U-bits are not involved with the calculation of the CRC bits. The combination 66 of the C-bits 60 and the RQI bit 62 and the CRC bits 68 are encoded according to a convolutional code into a coded sequence 70. The encoded symbols comprise the coded sequence 70. The U-bits remain unchanged.

The number of bits in the combination 66 depends on the rate of the convolutional encoder and the type of channel used, as is presented below in Table 5.

TABLE 5

| #bits/rate | 1/2 | 1/4 | 3/4 | 3/7 | 3/8 | 5/8 | 6/7 |
| --- | --- | --- | --- | --- | --- | --- | --- |
| Full rate | 217 | 109 |  | 189 | 165 |  |  |
| Half rate | 105 |  | 159 |  |  | 125 | 174 |

The two $R_A$ bits which represent the coding property are encoded in codewords 74, which represent the encoded coding property, according the code displayed in Table 3 or 4, dependent on the available transmission capacity (half rate or full rate). This encoding is only performed once in two frames. The codewords 74 are split in two parts 76 and 78 and transmitted in the present frame and the subsequent frame.

Figure 3:
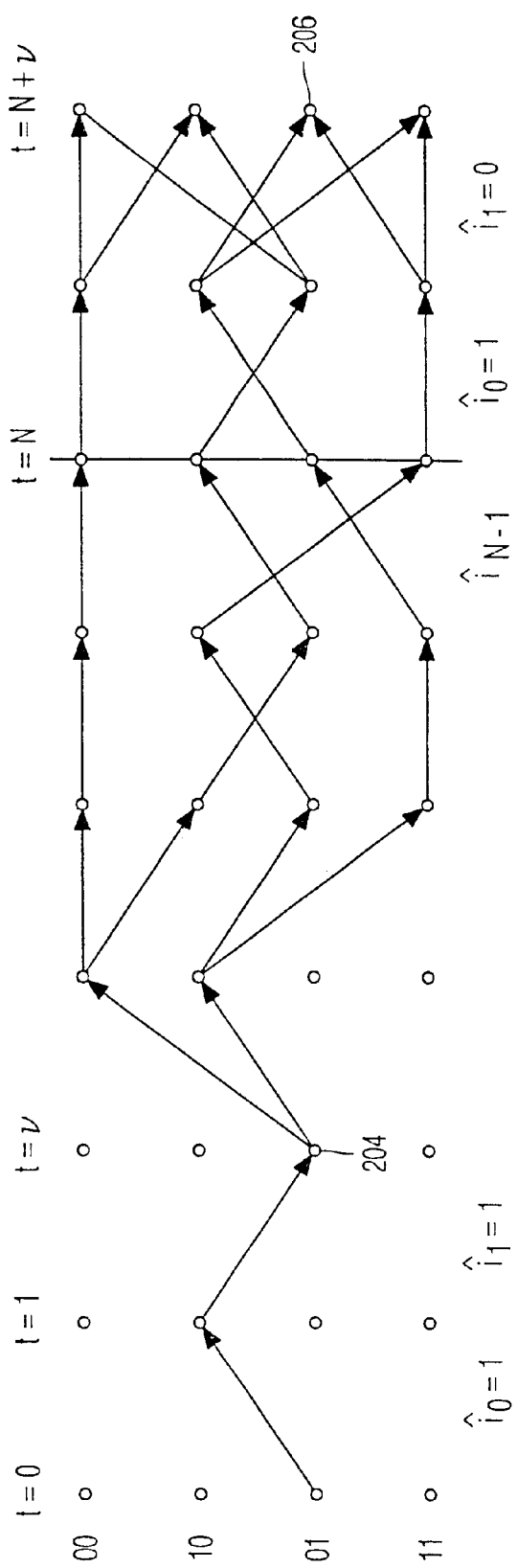
FIG. 3 shows a first trellis used in a decoder according to the present invention

FIG. 3 shows an example of a trellis to be used in the channel decoders 28 and 29 for determining the sequences of source symbols from the sequences of channel symbols. It is assumed that the source symbols are encoded using a convolutional channel encoder.

In a convolutional encoder, the sequence of source symbols are clocked into a shift register with length v. The state of the convolutional encoder is defined by the content of the shift register. If a binary convolutional encoder is used, the number of possible states of the convolutional encoder is equal to $2^v$. The channel symbols are obtained by combining several symbols available at different taps of the shift register by using modulo-two operations.

The channel decoder is arranged for estimating the state sequences as they are present during the encoding process in the decoder. This estimating is done by determining candidate state sequences on basis of a likelihood measure, further to be referred to as path metric. This path metric is determined from the channel signal and said candidate state sequences. The number of candidate sequences is equal to the number of states in the channel encoder.

At the beginning of the decoding process, each of the candidate sequences consists of one of the $2^v$ different states. The likelihood measures of all the states is set to equal values. After having received the channel signal corresponding to the initial state of the channel encoder, the candidate sequences are extended by constructing extended candidate sequences. Each extended candidate sequence comprises the originating candidate sequence to which one of the possible new states are appended. For each new state, the path metric for all the paths leading to said new state is calculated from the path metric of the originating state and a branch metric determined from the channel signal and the channel symbols corresponding to the transition between the originating state and the new state.

The decoding step is terminated by keeping only the path and the corresponding path metric of the best path leading to the new state.

In the channel decoder described by the trellis according to FIG. 3, the decoding is continued until the trellis has been extended N times, in which N is the number of source symbols. At that time, the state having the largest path metric is used as starting point for a trace back operation to find a earlier state, which is here the state 204 at the $v^{th}$ extension of the state sequence (t=v). From the trellis according to FIG. 3 it can be seen that the paths for $t \leq v$ are merged. The state 204 is stored for later use. After the state at t=N the decoding is continued until t=N+v. At t=N+v, the state 206 is selected as the state corresponding to the earlier state 204 which was stored at t=N. At state 206 the best path is selected, and this path is traced back to state 204 for determining the source symbols at each transition. It is observed that the source bit are not found in the correct order, but that they are circularly shifted over v symbols. By shifting them back over v symbols, the correct order can be restored.

It is preferable to delay the traceback to find the earlier state 204 until the state sequence has been extended to t=N+v. At t=N+v, the state having the largest path metric is selected and is used as starting point for the trace back operation to find the earlier state 204 at t=v. Subsequently the state 206 is selected as the final state, which is used for determining the sequence of source symbols.

Figure 4:
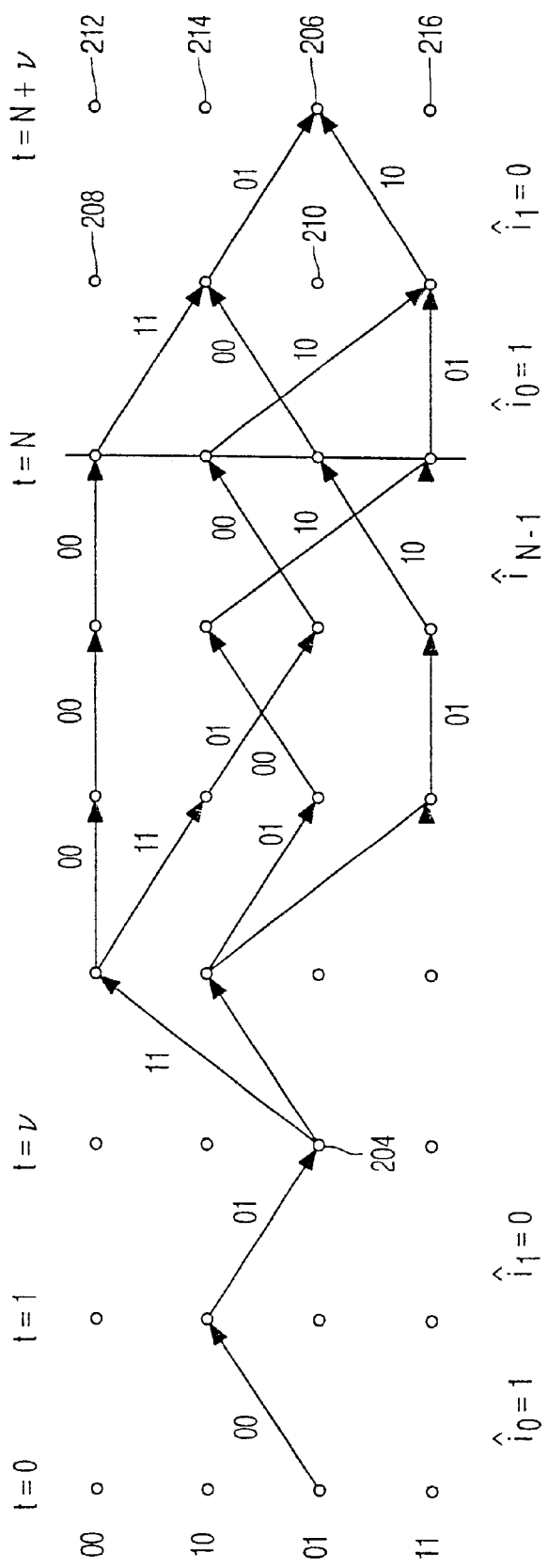
FIG. 4 shows a second trellis used in a decoder according to the present invention

In FIG. 4 a trellis of a slightly modified decoder is shown. This trellis differs only for t>N from the trellis according to FIG. 3. After the selection of the most likely state at t=N and the subsequent traceback to find the earlier state 204, the decoder forces the trellis to end in state 206. The states 208 and 210 are not included anymore, because they can not lead to state 206. For the same reason, the path metrics of the states 212, 214 and 216 are not determined.

Figure 5:
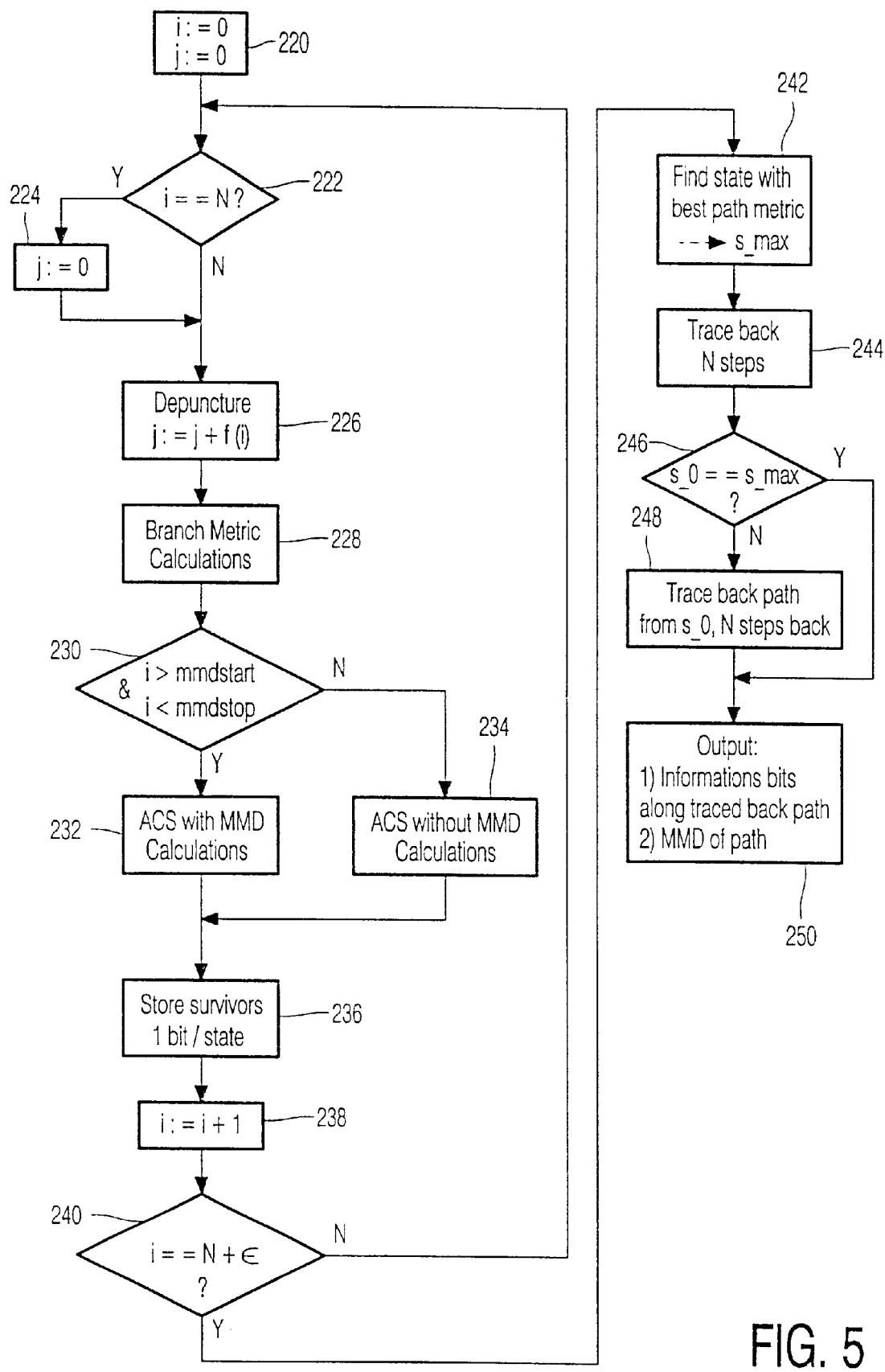
FIG. 5 shows a flow diagram of a program for a programmable processor for implementing a channel decoder according to the present invention.

In the flow diagram according to FIG. 5, the numbered blocks have the following meaning.

| No. | Inscription | Meaning |
| --- | --- | --- |
| 220 | i:=0<br>j:=0 | The source symbol pointer and the channel symbol index are initialized. |
| 222 | i==N ? | The value of i is compared with N. |
| 224 | j:=0 | The channel symbol index is reset to 0. |
| 226 | Depuncture<br>j:=j+f(i) | A depunturing operation is performed and the channel symbol index is updated accordingly. |
| 228 | Branch Metric Calculations | The new branch metrics are calculated |
| 230 | i>mmdstart & i<mmdstop | It is checked whether the source symbol pointer is in a predetermined range. |
| 232 | ACS with MMD calculations | The Add Compare Select operation, including the determination of the minimum metric distance is performed. |
| 234 | ACS without MMD calculations | The ACS operation is performed. |
| 236 | Store survivors | The survivors resulting from the ACS operation are stored. |
| 238 | i:=i+1 | The source symbol pointer is incremented. |
| 240 | i==N+ε ? | The source symbol pointer is compared with N + ε. |
| 242 | Find best state | The best state is selected. |
| 244 | Trace back N steps from s_max to s_0 | A trace back operation for finding the earlier state is performed. |
| 246 | s_0 = s_max ? | The selected state and the earlier state are compared. |
| 248 | Trace back N steps from s_max with s_max set to s_0 | The state s_max is made equal to state s_0 and a trace back operation to the earlier state is performed. |
| 250 | Output source symbols and MMD | The source symbols and the corresponding MMD are made available at the output. |

In the program according to the flow diagram of FIG. 5 it is assumed that the channel signal is sampled with the channel symbol period, and that the channel symbol samples are stored for later use. It is further observed that it is possible that a punctured convolution code is used. In a punctured conolutional coder, channel symbols at predetermined positions are simply deleted. In the corresponding decoder, the channel signal value is set to zero.

In instruction 220 the source symbol pointer i and the channel symbol index j are set to a value of 0. In instruction 222, the source symbol pointer i is compared with N. If i is equal to N, state sequences of length N have been determined, and all channel signal samples have been used once. In order to extend the encoding process, the first samples of the channel signal have to be re-used. This is obtained by resetting the channel symbol index to 0. In instruction 226 the channel signal samples to be used with the next to be performed branch metric calculations are determined. If a punctured convolutional code is used, the channel signal samples corresponding to non-an ted channel symbols are set to a value of zero.

In instruction 228 the branch metrics are calculated. For each possible combination of new state and previous state the corresponding channel symbols are read from a table. The branch metric corresponding to said combination of new state and previous state is determined by calculating a correlation value between the channel signal samples and the channel symbols read from the table. It is observed that for the calculation of the correlation value a symbol value of 0 is represented by −1 and that a symbol value of 1is represented by +1, because the ideal values of the channel signal samples are +a and −a. Channel signal samples corresponding to depunctured symbols are set to 0, indicating an erasure.

In instruction 230 it is checked whether the source symbol pointer lies in a range between mmdstart and mmdstop. The values mmdstart and mmdstop define a range within the trellis in which the quality measure is determined. If i falls outside the range, the program continues at instruction 234 for performing the Add Compare Select operation.

For each new state, the path metric of all paths ending in said new state is calculated. This is done by adding the branch metric calculated in instruction 234 to the state metric of the corresponding previous state. Subsequently the path metrics of the different paths ending in said new state are compared, and the path having the largest path metric is selected. The other paths are discarded. In the case of binary convolutional codes derived from a 1/n basic code, only two paths end in each new state. This add compare select operation is performed for each new state.

In instruction 232 the same operation as in instruction 234 is performed, but now also the MMD value is calculated. A metric difference (MD) is the difference between the two path metrics of the competing paths ending in a new state. The MMD value of a path is the minimum value of the metric difference (MD) encountered on said path. The MMD value of the path finally selected is a good measure for the transmission quality. The implementation effort for determining the MMD is quite modest. Only a memory for keeping track of the MMD for each state has to be added. The calculations to be performed are also needed for the add compare select operation. The use of the MMD as measure for the transmission quality is generally applicable. Its use is not restricted to the "tail biting" or "zero tailing" codes discussed herein.

In instruction 236 the surviving state sequences are stored. This is done by storing for each state one symbol (one bit in the case of two possible paths ending in a state) for each state transision. This symbol uniquely defines the state transition. The value of the symbol may be taken equal to the source symbol corresponding to said transition.

In instruction 238 the source symbol pointer is incremented to prepare processing of the next stage of the trellis.

In instruction 240, the value of the source symbol pointer i is compared with a value N+ε. The value of ε is chosen as compromise between the decoding complexity and the decoding quality. Experiments have shown that a suitable value for ε is ν. For reduction of complexity, it can be advantageous to make ε equal to a multiple of the puncturing period of the convolutional code. In a simulated system a value of ε between 2ν and 2ν+2 is used.

If the value of i is smaller than N+ε, the program is continued at instruction 222 for processing the next stage of the trellis. Otherwise the program is continued at instruction 242. In instruction 242, the state having the largest path metric is selected as the best final state.

In instruction 244, a trace back operation is performed to find the earlier state.

This is done by recursively reconstructing the states passed by the selected path until the earlier state is reached. For this use is made of the (source) symbols stored with the selected path. These symbols stored along the path are stored separately.

In instruction 246, the best final state selected in instruction 242 is compared with the earlier state found in instruction 144. If both states are the same, the program continues at instruction 250. If both states differ, in instruction 248 the state found as the earlier state is selected as final state, and a trace back until the earlier state is performed to determine all the source symbols.

In instruction 250, the reconstructed source sequence is passed to the output of the source encoder together with the MMD value associated with the finally selected final state.

What is claimed is:

1. A transmission system comprising:
   a transmitter comprising a channel encoder for encoding sequences of source symbols into sequences of channel symbols and being arranged for transmitting a channel signal representing the channel symbols to a receiver,
   a receiver comprising a channel decoder for deriving the sequences of source symbols from a channel signal representing the channel symbols by keeping track of a plurality of state sequences with a corresponding likelihood measure representing the likelihood measure of the state sequences,
   wherein the channel decoder determines the final state sequence by comparing the likelihood measures of a plurality of candidate state sequences terminating in said state and selecting the state sequence with the largest likelihood measure, and the channel decoder further determines the respective difference measures between the likelihood measure of the selected candidate sequence and the likelihood measures of the rejected candidate sequences;
   whereby the minimum difference of likelihood measures determined between the selected candidate sequence and the rejected candidate sequences is a criterion for at least measuring the reliability of the final state sequence.

2. The transmission system according to claim 1, wherein the channel decoder is arranged for extending, on basis of a cyclically extended channel signal, the state sequence beyond a number of states equal to the number of source symbols in a sequence of source symbols and in that the channel doctor is arranged for selecting the final state sequence on basis of the terminating states of the extended state sequences.

3. The transmission system according to claim 2, wherein the channel decoder is arranged for determining the suitable state sequence when the state sequences comprise a number of states equal to the number of source symbols in a sequence of source symbols.

4. The transmission system according to claim 2, wherein the channel encoder is arranged for determining the suitable state sequence from terminating states of the extended state sequence.

5. The transmission system according to claim 1, wherein the channel decoder is arranged for keeping track of the minimum difference measure for each of the state sequences.

6. The transmission system as claimed in claim 1, wherein the channel decoder is arranged for selecting a suitable state sequence after the channel signal has been processed at least once, determining from said suitable state sequence, an earlier state in said suitable state sequence, and in that the channel decoder is arranged for selecting as final state sequence the state sequence terminating in a state corresponding to said earlier state.

7. A receiver for receiving sequences of channel symbols being derived from source symbols, the receiver comprising a channel decoder for deriving the source symbols from a channel signal representing the channel symbols by keeping track of a plurality of state sequences with a corresponding likelihood measure representing the likelihood of the state sequences,
   wherein the channel decoder determines the final state sequence by comparing the likelihood measures of a plurality of candidate state sequences terminating in said state and selecting the state sequence with the largest likelihood measure, and the channel decoder further determines the respective difference measures between the likelihood measure of the selected candidate sequence and the likelihood measures of the rejected candidate sequences;
   whereby the minimum difference of likelihood measures determined between the selected candidate sequence and the rejected candidate sequences is a criterion for at least measuring the reliability of the final state sequence.

8. The receiver as claimed in claim 7, wherein the channel decoder is arranged for selecting a suitable state sequence after the channel signal has been processed at least once, determining from said suitable state sequence, an earlier state in the state sequence, and in that the channel decoder is arranged for selecting as final state sequence the state sequence which terminates in a state corresponding to said earlier state.

9. A channel decoder for deriving source symbols from a channel signal representing a sequence of channel symbols by keeping track of a plurality of state sequences with a corresponding likelihood measure representing the likelihood of the state sequences,
   wherein the channel decoder determines the final state sequence by comparing the likelihood measures of a plurality of candidate state sequences terminating in said state and selecting the state sequence with the largest likelihood measure, and the channel decoder further determines the respective difference measures between the likelihood measure of the selected candidate sequence and the likelihood measures of the rejected candidate sequences;
   whereby the minimum difference of likelihood measures determined between the selected candidate sequence and the rejected candidate sequences is a criterion for at least measuring the reliability of the final state sequence.

10. A transmission method comprising encoding sequences of source symbols into sequences of channel symbols, transmitting a channel signal representing the channel symbols to a receiver, receiving a channel signal, deriving the source symbols from the channel signal representing the channel symbols by keeping track of a plurality of state sequences, determining the final state sequence by comparing the likelihood measures of a plurality of candidate state sequences terminating in said state; selecting the state sequence with the largest likelihood measure; and determines the respective difference measures between the likelihood measure of the selected candidate sequence and the likelihood measures of the rejected candidate sequences;
   whereby the minimum difference of likelihood measures determined between the selected candidate sequence and the rejected candidate sequences is a criterion for at least measuring the reliability of the final state sequence.

11. A decoding method for deriving source symbols from a channel signal representing a sequence of channel symbols by keeping track of a plurality of state sequences with a corresponding likelihood measure representing the likelihood of the state sequences, determining the final state sequence by comparing the likelihood measures of a plurality of candidate state sequences terminating in said state; selecting the state sequence with the largest likelihood measure; and determines the respective difference measures between the likelihood measure of the selected candidate sequence and the likelihood measures of the rejected candidate sequences;

whereby the minimum difference of likelihood measures determined between the selected candidate sequence and the rejected candidate sequences is a criterion for at least measuring the reliability of the final state sequence.

* * * * *